United States Patent [19]

Hollingsworth

[11] 4,114,055

[45] Sep. 12, 1978

[54] UNBALANCED SENSE CIRCUIT

[75] Inventor: Richard James Hollingsworth, Princeton, N.J.

[73] Assignee: RCA Corporation, New York, N.Y.

[21] Appl. No.: 796,333

[22] Filed: May 12, 1977

[51] Int. Cl.² .................. H03K 5/20; H03K 3/286; G11C 7/00; G11C 11/40
[52] U.S. Cl. .................................. 307/362; 37/238; 307/279; 307/288; 307/DIG. 3; 365/184; 365/205
[58] Field of Search .............. 307/238, 279, 288, 291, 307/355, 362, 363, 200 B, DIG. 3; 365/184, 185, 205

[56] References Cited

U.S. PATENT DOCUMENTS

| 3,457,435 | 7/1969 | Burns et al. .................. 307/304 X |
| 3,868,656 | 2/1975 | Stein et al. .................. 307/279 X |
| 3,879,621 | 4/1975 | Cavaliere et al. ......... 307/DIG. 3 X |
| 3,895,360 | 7/1975 | Cricchi et al. ............ 307/DIG. 3 X |
| 3,902,082 | 8/1975 | Proebsting et al. .................. 307/279 |
| 3,983,543 | 9/1976 | Cordaro ................... 307/DIG. 3 X |
| 3,983,544 | 9/1976 | Dennison et al. ......... 307/DIG. 3 X |
| 3,983,545 | 9/1976 | Cordaro .......................... 307/279 X |
| 3,992,704 | 11/1976 | Kantz ....................... 307/DIG. 3 X |

OTHER PUBLICATIONS

Lohman, "Applications of MOS FETs in Microelectronics"; SCP and Solid-State Technology, (pub.); pp. 23-29; 3/1966.
Krick, IBM Tech. Discl. Bull.; vol. 17, No. 6, pp. 1811-1813; 11/1974.

Primary Examiner—Larry N. Anagnos
Attorney, Agent, or Firm—H. Christoffersen; Henry I. Schanzer

[57] ABSTRACT

The sense circuit includes first and second inverters connected at their inputs to a signal input node and a reference node, respectively. The inverters are selectively biased to different quiescent points for charging the signal input node and the reference node to different quiescent voltage levels. Signals applied to the signal input and reference nodes cause the potential at these nodes to vary from their quiescent values. The inverters are selectively cross-coupled to form a flip flop whose binary value is determined by the outputs of the inverters. For the same value of signals applied to the two nodes the flip flop is set to the state dictated by the initial voltage offset due to the difference in the quiescent points of the inverters.

10 Claims, 5 Drawing Figures

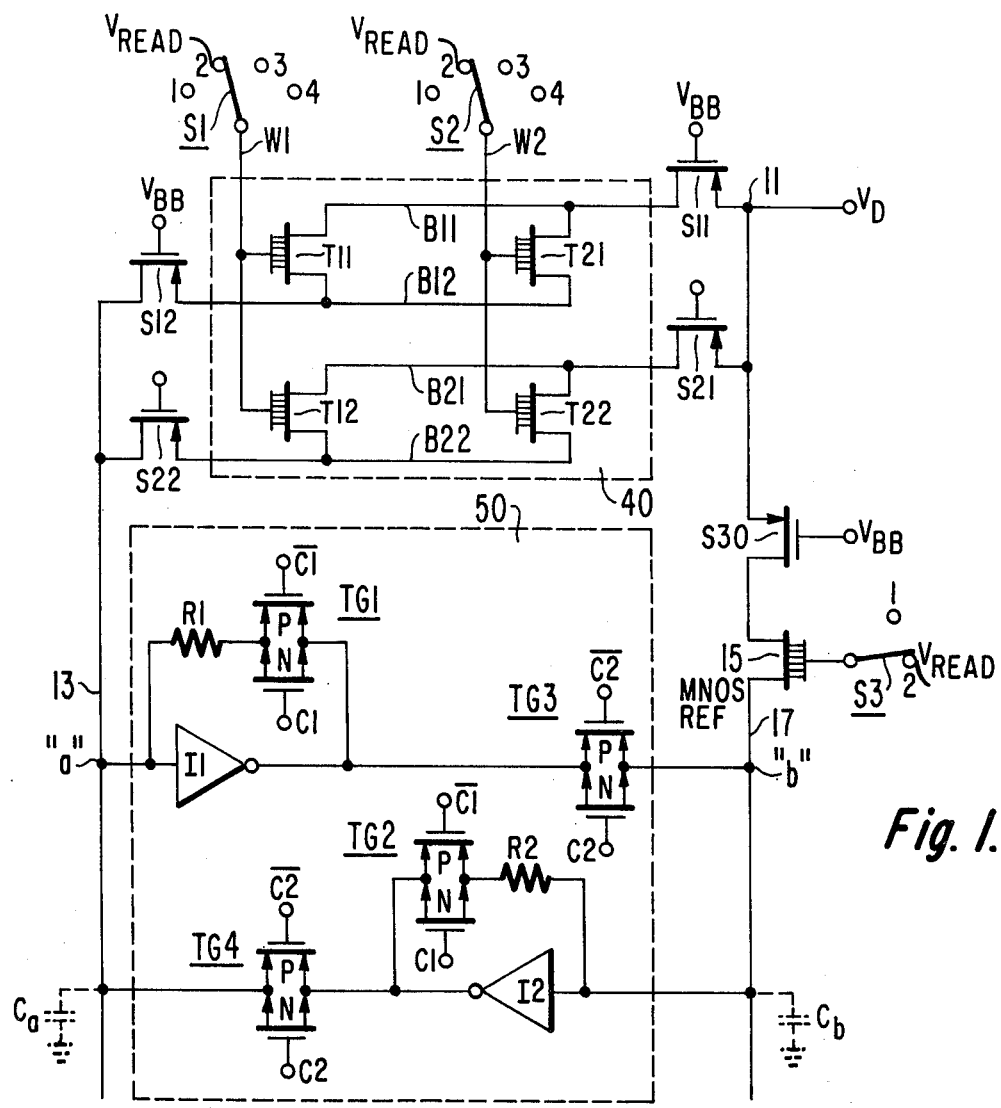
Fig. 1.
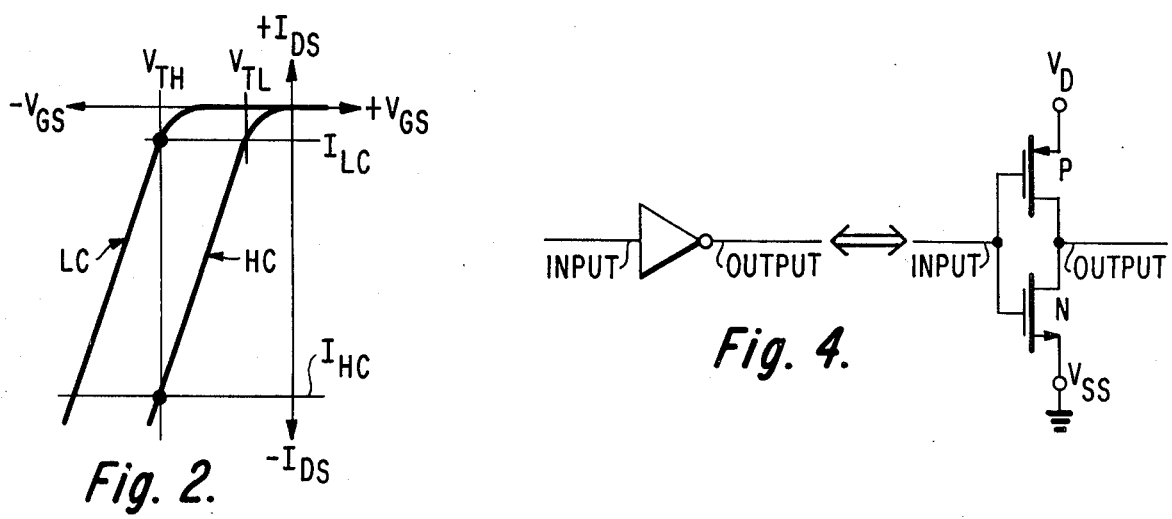
Fig. 2.
Fig. 4.

UNBALANCED SENSE CIRCUIT

BACKGROUND OF THE INVENTION

This invention relates to sense circuits and in particular to sense circuits capable of producing unambiguous outputs when comparing signals of approximately equal value.

In some applications, the state or condition of an element or device can be best determined only by comparing it with a like element or device operated as a reference. For example, a problem exists in sensing the state of the metal-nitride-oxide-semiconductor (MNOS) transistors of a memory array because their threshold voltages ($V_T$) shift as a function of the number of times and the sequence in which the MNOS transistors are set to a high ($V_{TH}$) or a low ($V_{TL}$) threshold voltage condition.

Since the $V_T$'s may shift above or below their original setting, comparison with a fixed reference is not satisfactory. A solution to this problem resides in designating an MNOS transistor as a reference and subjecting it to similar stresses to which the other MNOS transistors are subjected. This ensures that the characteristics of the reference transistor will track those of the other MNOS transistors and solves the problem of having a suitable reference. However, a problem still exists in that, the element being sensed and the reference element, due to their similar characteristics, produce like signals when, for example, they are set to the same $V_T$ condition.

Distinguishing between two like signals is difficult. A balanced sense circuit looking at two virtually identical input signals would produce an indeterminate output signal or, if it included regenerative feedback, would flip to one of its stable states in a relatively random manner producing an erroneous or ambiguous indication of the condition of the element being sensed. For the example of the MNOS transistors, the transistor being sensed and the reference transistor could both be at the same $V_T$ condition. However, small differences in the characteristics of the transistors and/or small amounts of noise in the system might cause the signal produced by the transistor being sensed to be greater (or less) than the signals produced by the reference transistor. A balanced sense circuit comparing the two signals would then produce an erroneous indication of the true state of the transistor being sensed.

SUMMARY OF THE INVENTION

Accordingly, sense circuits embodying the invention includes an offset, or unbalance, to produce a given predetermined output condition when approximately equal signals are applied to their inputs.

A sense circuit embodying the invention includes first and second inverters designed to have different quiescent points when biased. The first and second inverters are connected at their inputs to first and second nodes, respectively, and each inverter is connected at its output via a selectively enabled cross-coupling transmission gate to the input of the other. Connected between the input and the output of each inverter is a selectively enabled biasing transmission gate for selectively biasing the inverter inputs and outputs to their different quiescent points.

The sense circuit has a precharge mode, a sense mode, and a latch mode. During the precharge mode the first and second nodes are charged to different voltages corresponding to the different inverter quiescent points. During the sense mode a signal to be sensed and a reference signal are applied to the first and second nodes, respectively, causing the inverter outputs to vary from their quiescent values. During the latch mode, the inverters are cross-coupled forming a flip flop whose state is determined by the outputs of the inverters. If the values of signals applied to the first and second nodes, are substantially equal, the flip flop is set to the state dictated by the difference in the quiescent points of the inverters.

BRIEF DESCRIPTION OF THE DRAWING

In the accompanying drawings, like reference characters denote like components; and FIG. 1 is a schematic drawing of a memory array of MNOS transistors coupled to a sense circuit embodying the invention;

FIG. 2 is a drawing of the voltage-current (V-I) characteristic of an MNOS transistor;

FIG. 4 includes a block diagram of an inverter and the corresponding schematic diagram of a Complementary Metal-Oxide-Semiconductor (CMOS) inverter useful in practicing the invention.

DESCRIPTION OF THE PREFERRED EMBODIMENTS

Figure 3:
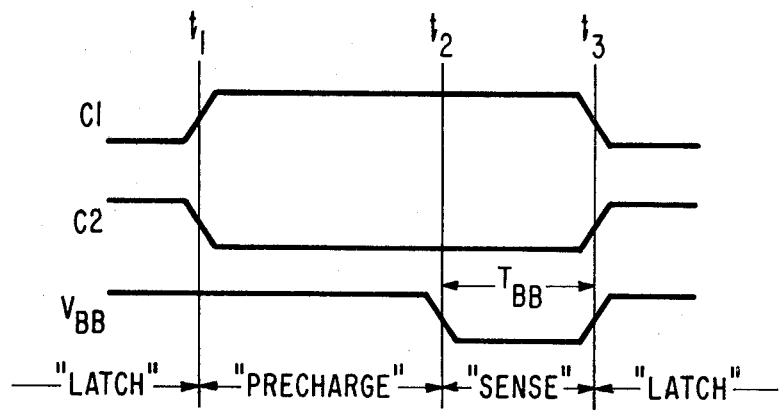
FIG. 3 is a drawing of the waveforms applied to various points of the circuits of FIG. 1.

The system of FIG. 1 includes a memory array 40 of MNOS transistors, a reference MNOS transistor 15, means for selectively reading out the contents of one of the MNOS transistors, onto a node and concurrently reading out the contents of transistor 15 onto node $b$, and a sense circuit 50 for comparing the signals produced at nodes $a$ and $b$ and producing logic level signals indicative of the difference in the voltages at nodes $a$ and $b$. The word lines (W1, W2) of memory array 40 are selectively connected to the wiper arm of switches S1, S2. The array 40 may have M words of N bits each, where M and N are integers and M and N may, or may not, be equal. For ease of illustration, in the circuit of FIG. 1, N equals M equals 2. Each bit location includes a single MNOS transistor of P conductivity type denoted by TMN where M defines the word position and N defines the bit position. The transistors making up a column (word) have their gate electrodes connected in common to a word line. The transistors making up a row (all having the same bit significance) have one end of their conduction paths connected to a first bit line denoted $B_{N1}$ and the other end of their conduction paths connected to a second bit line denoted $B_{N2}$, where N, as before, refers to the bit position. Each one of the $B_{N1}$ bit lines is connected via a P-conductivity type transistor switch, $S_{N1}$, to a point of operating potential 11 to which is applied a positive potential of $V_D$ volts. Each one of the $B_{N2}$ bit lines is connected via a P conductivity type switching transistor $S_{N2}$ to digit line 13 also denoted as node "$a$".

The source-to-drain path of a P conductivity type transistor switch S30 is connected between terminal 11 and the source of an MNOS reference transistor 15. The drain of transistor 15 is connected to line 17 which is also denoted as node "$b$". Capacitors Ca and Cb (shown in phantom view) connected to nodes $a$ and $b$, respectively, represent the capacitances associated with these nodes. The gate of transistor 15 is connected to the wiper arm of switch S3. During a "Read" cycle, switch S3 is connected to position 2 to which is applied a potential $V_{READ}$ and switches S1 and S2 are respectively set, one at a time, to position 2 to which is applied the potential $V_{READ}$. Switching transistors $S_{N1}$, $S_{N2}$ and S30 are turned on and off by a control signal $V_{BB}$ applied to their gates. When turned on, by $V_{BB}$ going to zero volts, the switching transistors are assumed to have a relatively low source-to-drain impedance.

MNOS transistors have a threshold voltage which is electrically alterable and which may be set to many different levels. In digital systems, the MNOS transistors are normally set to either a high threshold value ($V_{TH}$) or a low threshold value ($V_{TL}$). One of $V_{TL}$ and $V_{TH}$ is assigned the value of logic zero and the other is assigned the value logic 1. Thus, each memory transistor in array 40 either stores a logic "1" or a logic "0". An MNOS transistor is set to $V_{TH}$ or to $V_{TL}$ by applying a given potential of greater than a given reference value between the gate and the substrate (across the insulating layers) in a direction to either enhance conduction or inhibit conduction. The circuitry necessary to set the MNOS transistors to selected states is not shown. Many such circuits are known and any one of these may be used.

FIG. 2 shows a plot of the source-to-drain current ($I_{DS}$) through an MNOS transistor as a function of the gate-to-source potential ($V_{GS}$) for a fixed drain potential. The characteristics shown are for a P type MNOS transistor and, therefore, $I_{DS}$ and $V_{GS}$ are shown as negative values. When the $V_T$ of an MNOS transistor is set to $V_{TL}$, its $I_{DS}$ follows the high conduction (HC) curve, and when its $V_T$ is set to $V_{TH}$, its $I_{DS}$ follows the low conduction (LC) curve. In the discussion to follow, it is assumed that reference transistor 15 is set to $V_{TH}$ and hence is in the LC state.

During the Read cycle, information contained in a selected transistor of array 40 is read out and applied to node $a$ and compared to the information contained in transistor 15 which is applied to node $b$. For example, to read out the contents of T11 switches S1 and S3 are set to position 2 to apply $V_{READ}$ to the gates of transistors T11 and 15 and transistors S11, S12 and S30 are turned on. Currents can then flow from terminal 11 via the conduction paths of transistors T11 and 15, into nodes "$a$" and "$b$" respectively.

The signals applied to nodes "$a$" and "$b$" are sensed by Sense Circuit 50 which includes two inverters (I1, I2), four complementary transistor transmission gates (TG1, TG2, TG3 and TG4), and two biasing resistors R1, R2.

Each one of transmission gates TG1, TG2, TG3 and TG4 includes two insulated-gate field-effect transistors (IGFETs) of complementary conductivity type (N and P) having their conduction paths connected in parallel. The conduction path of biasing transmission gate TG1 is connected in series with resistor R1 between the input and the output of inverter I1. The conduction path of biasing transmission gate TG2 is connected in series with resistor R2 between the input and output of inverter I2. The ohmic values of resistors R1 and R2 are not critical in this application. When gates TG1 and TG2 are enabled, resistors R1 and R2 are connected via the low impedance paths of the gates between the outputs and inputs of their associated inverters. The resistors determine the amount of negative feedback across the inverters and thereby determine, in part, the voltage gain of the inverter-amplifier. But, they have little effect in setting the quiescent points of the inverters. Clock signals C1 and $\overline{C1}$ are applied to the gate electrodes of the N and P transistors, respectively, of gates TG1 and TG2. Gates TG1 and TG2 are enabled when C1 is high ($V_D$) and $\overline{C1}$ is low. In the circuit of FIG. 1, the "low" is equal to $V_{SS}$ volts which is assumed to be ground or zero points.

The conduction path of transmission gate TG3 is connected between the output of inverter I1 and node "$b$" and the conduction path of transmission gate TG4 is connected between the output of inverter I2 and node "$a$". Clock signals C2 and $\overline{C2}$ are applied to the gate electrodes of the N and P transistors, respectively, of gates TG3 and TG4. Gates TG3 and TG4 are enabled when C2 is high ($V_D$) and $\overline{C2}$ is low ($V_{SS}$). The relationship between clocks C1, and C2 is shown in FIG. 3. When gates TG1 and TG2 are enabled, gates TG3 and TG4 are disabled and, vice versa, when gates TG1 and TG2 are disabled, gates TG3 and TG4 are enabled. When gates TG3 and TG4 are enabled, inverters I1 and I2 are cross-coupled to form a flip flop.

Assume that inverters I1 and I2 are complementary inverters of the type shown in FIG. 4. Each one of inverters I1 and I2 includes an insulated-gate field-effect transistor (IGFET) of N conductivity type and another IGFET of P conductivity having their conduction paths connected in series between $V_D$ and $V_{SS}$. The drain electrodes and the gate electrodes of the two IGFETs of each inverter are connected to the output and input, respectively, of its inverter. Inverter I1 is connected at its input to node "$a$" and inverter I2 is connected at its input to node "$b$". When gates TG1 and TG2 are enabled, inverters I1 and O2 are "self-biased" in the linear portion of their transfer characteristics and function as linear amplifiers.

An inherent characteristic of IGFET inverters is that, due to their extremely high input impedances, their input currents are negligible. For the "self-bias" condition, which exists when TG1 and TG2 are enabled, there is substantially no voltage drop across resistors R1 and R2. Each inverter-amplifier is then biased in the linear region at the point at which its output voltage ($V_O$) is equal to its input voltage ($V_{IN}$). The bias point, switching point, or quiescent point ($V_Q$) of a complementary inverter for the single-resistor biasing or "self-bias" arrangement occurs at the intersection of its transfer curve and the line satisfying the equation $V_O = V_{IN}$ as shown in FIG. 5.

The shape of the transfer curve of a complementary inverter is dependent (among others) on the characteristics of the N and P transistors forming the inverters. The $V_Q$ of a self biased complementary inverter (with no external input signal applied) is a function of the impedances of its P and N transistors. The impedance (Z) of each transistor is in turn a function of the ratio of its channel length (L) to its channel width (W), $[Z = f(L/W)]$.

Figure 5:
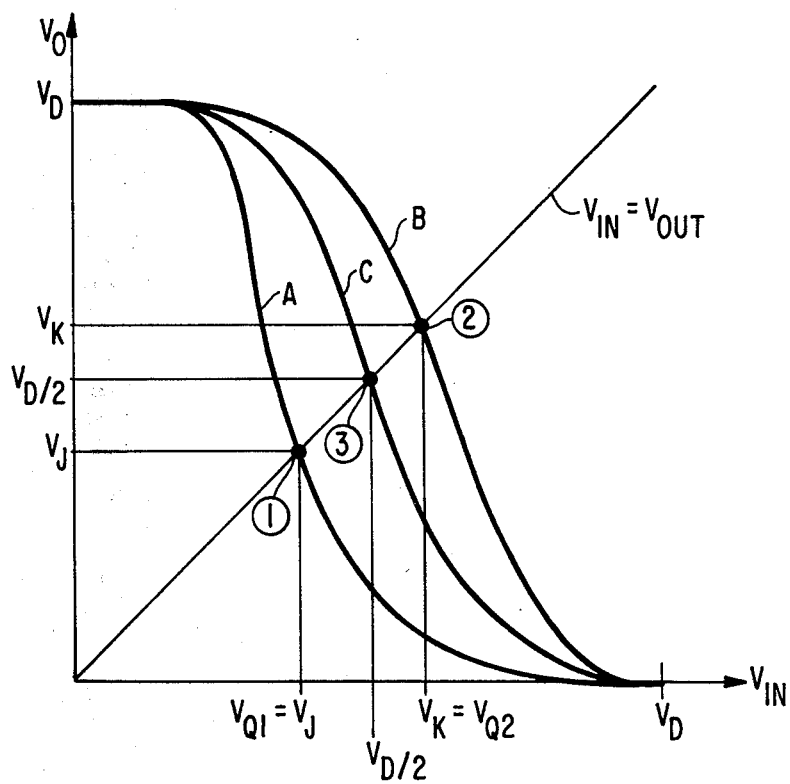
FIG. 5 is a drawing of the transfer characteristics of inverters useful in practicing the invention.

The quiescent point ($V_{Q1}$) of inverter I1 is made to be different than that quiescent point ($V_{Q2}$) of inverter I2 by proper selection and design of the width to length (W/L) ratios of the IGFETs forming the inverters; [This assumes that the other IGFET parameters, (e.g. the threshold voltages, oxide thickness, doping levels), are the same.] Referring to FIG. 5, curves A and B are the transfer voltage characteristics for inverters I1 and I2, respectively. Curve C, shown for comparison, represents the transfer characteristic of an inverter whose P and N IGFETs have equal impedances for the same value of gate to source voltage ($V_{GS}$). In curve C, $V_Q = V_O = V_{IN} = V_D/2$.

To set the $V_{Q1}$ of inverter I1 below $V_D/2$, its N-IGFET is made physically larger than its P-IGFET, and the W/L ratio of its N IGFET is made greater than the W/L ratio of its P-IGFET. As a result, the impedance of the N IGFET is lower than the impedance of the P-IGFET for the same value of $V_{GS}$. $V_{Q1}$ is then equal to $V_J$ which is less than $V_D/2$ as shown for point ①on curve A.

To make $V_{Q2}$ more positive than $V_{Q1}$ the channel width of the P-IGFET of inverter I2 is made larger than that of its N-IGFET and the W/L ratio of the P-IGFET is made greater than the W/L ratio of the N-IGFET. $V_{Q2}$ is then equal to $V_K$ which is more positive than the value $V_J$ of $V_{Q1}$ as shown at point ② on curve B.

The operation of the sense circuit during a Read cycle will now be explained. Each "read" cycle includes a precharge period, followed by a sense period during which new information is sensed, and finally a latch period during which the sense circuit functions as a flip flop and stores the sensed information.

Just prior to reading out the contents of an MNOS transistor of array 40, a precharge period is initiated by clock C1 going high and clock C2 going low at time $t_1$ as shown in FIG. 3. Cross coupling gates TG3 and TG4 are then disabled while biasing gates TG1 and TG2 are enabled. Assume $V_{Q1}$ to be equal to $V_J$ which is less than $V_D/2$, and $V_{Q2}$ to be equal to $V_K$ which is greater than $V_D/2$ as shown at points ① and ② on waveforms A and B of FIG. 5. Each inverter charges the sense line to which its input is directly connected to the value of its quiescent voltage via its feedback connection. That is, node "a" gets charged to $V_{Q1}$, from the output of I1 via TG1 and resistor R1 while node "b" gets charged to $V_{Q2}$ from the output of I2 via TG2 and resistor R2. During the precharge period, nodes "a" and "b" are disconnected from the reference transistor and memory array (S12, S22 and S30 are off) and, regardless of their initial potential, will be driven to $V_{Q1}$ and $V_{Q2}$, respectively, at the termination of the precharge period, just prior to time $t_2$. Thus, inverters I1 and I2 and their biasing networks (TG1, R1 and TG2, R2) also function to precharge nodes "a" and "b" to predetermined levels.

Following the precharge period a sense period is initiated, at time $t_2$ in FIG. 3, during which the state of a selected device is sensed. Assume, as discussed before, that transistors S11, S12 and S30 are turned on (by $V_{BB}$ going to zero volts) and transistors T11 and 15 are turned on (by switches S1 and S3 being set to position 2). Assume that $V_{READ}$ applied to the gates of transistors T11 and 15 is approximately equal to $V_{TH}$.

Assume as a first instance, that T11 is in the high conduction (HC) state. In the HC state, transistor T11 passes a current of high amplitude $I_{HC}$, shown in FIG. 2, which flows from terminal 11 via the conduction paths of transistors S11, T11 and S12 onto capacitive node "a". The HC current causes the potential $V_a$ at node "a" to rise very quickly towards $V_D$ volts.

Concurrently, transistor 15 passes a current of low amplitude $I_{LC}$, as shown in FIG. 2, which flows from terminal 11 via the conduction paths of transistors S30 and 15 onto node "b". The $I_{LC}$ current causes the potential $V_b$ at node "b" to rise slowly towards $V_D$ volts. $V_b$ is clearly much less positive than $V_a$. The highly positive potential on node "a" causes the output of inverter-amplifier I1 to go low towards $V_{SS}$. The rising potential on node "b" also causes the output of inverter-amplifier I2 to go negative. But, whereas the output of inverter I1 will quickly be driven to ground potential, the output of inverter I2 remains more positive. The period of time, $T_{bb}$, during which signal and reference currents are allowed to flow into nodes "a" and "b" is set to be less than the time it takes $I_{LC}$ to charge node "b" and develop a voltage level thereat such that the output of inverter I2 is driven to $V_{SS}$ volts.

At the termination of the sense period (time $t_3$ in FIG. 3) transistors S11, S12 and S30 are turned off, interrupting the further flow of signal and reference currents. Concurrently, clocks C1 and C2 go low and high, respectively.

The biasing gates TG1 and TG2 are then turned off and the cross-coupling gates TG3 and TG4 are then turned on cross-coupling inverters I1 and I2. As soon as the cross coupling transmission gates are turned on, the difference between $V_a$ and $V_b$ causes $V_a$ to go to $V_D$ volts and $V_b$ to go to $V_{SS}$ volts. The output of inverter I1 drives node "b" to ground causing the output of inverter I2 to go to $V_D$ volts. The output of inverter I2 is positively fed back to the input of inverter I1 causing its output to be further clamped to ground. Inverters I1 and I2 then latch, with node "a" at a high ($V_D$) level and node "b" at a low (ground) level. Cross-coupling the two inverters forms a flip flop which statically stores the sensed information. Corresponding to T11 being in the HC ($V_{TL}$) state, node "a" is high or logic "1" and node "b" is low or logic "0".

Now, let us examine the operation of the circuit in a second instance when T11 is in the LC ($V_{TH}$) state. Assume, as above, that nodes "a" and "b" are precharged to $V_J$ and $V_K$ volts, respectively, that switches S11, S12 and S30 are turned on, and that switches S1 and S3 are set to position 2.

Approximately equal currents of amplitude $L_{LC}$ flow from node 11 into nodes "a" and "b" causing the potential at these nodes to rise at approximately the same rate. But, node "b" begins it's rise from $V_K$ volts while node "a" begins its rise from $V_J$ volts. The voltage differential ($V_K$–$V_J$) between nodes "a" and "b" is maintained during the sense period, $T_{BB}$. At time $t_3$, the end of the sense period, node "b" is still more positive than node "a". The biasing transmission gates TG1 and TG2 are then disabled while the cross-coupling transmission gates TG3 and TG4 are turned on. The input ($V_b$) to inverter I2 is more positive than the input ($V_a$) to inverter I1 and the output of inverter I2 is then more negative than the output of inverter I1.

As soon as the biasing is removed and the cross-coupling is applied, inverters I1 and I2 form a flip flop which is extremely sensitive to the difference in the signals at nodes "a" and "b". The output of inverter I2 and the input to inverter I1 are quickly driven to ground (low), whereas the output of inverter I1 and the input to inverter I2 are quickly driven to $V_D$ volts (high). The flip flop is, therefore, set to a stable state indicative of the difference of the voltages at nodes "a" and "b". Corresponding to T11 and the LC ($V_{TH}$) state node "a" is set to $V_{SS}$ (low or logic "0") and node "b" is set to high or logic "1". The unbalance or offset in the quiescent points of inverters I1 and I2 thus enables the unambiguous production of an output signal when the input signal (to node a) and the reference signal (to node "b") are approximately equal. The offset amplitude may be set to allow for variations in transistor characteristics and for noise perturbations.

In the operation of the circuit of FIG. 1, it has been assumed, as shown in FIG. 3, that the negative feedback around each inverter is removed (TG1, TG2 are turned off) when the cross-coupling transmission gates are turned on. However, the negative feedback around the inverters can be maintained while the inverters are being cross coupled.

The sense circuit is "symmetric" to sense currents. That is, the sense circuit may be used in conjunction with a memory array whose elements discharge the sense nodes $a$ and $b$ rather than with a memory whose elements charge the nodes.

In the discussion above, reference transistor 15 was assumed to be set to the $V_{TH}$(LC) state. However, the system can also function where the reference transistor is set to the $V_{TL}$(HC) state. In such event, $V_{Q2}$ would be set at a point more negative than $V_{Q1}$ and the sense period, $T_{BB}$, would have to be very short. Furthermore, whereas the sense circuit is particularly useful in conjunction with MNOS memory arrays it is also useful in conjunction with other memory systems using other devices.

In brief, the disclosed circuit utilizes a reference MNOS device which is fixed in one of the threshold voltage states assumed by MNOS transistors (e.g. the LC state). An interrogated memory cell is compared to the reference cell by enabling both devices simultaneously such that current is provided to each side of a sense circuit embodying the invention. The sense circuit includes complementary inverters which possess a particular transfer characteristic whose inputs can be precharged to the quiescent points of the inverters via transmission gates. By using two inverters of differing characteristics an inherent voltage difference is designed into the sense system. This voltage difference enables the circuit to distinguish between two MNOS transistors in the same threshold voltage state. The two inverters are then simply cross-coupled to form a flip flop which latches to one or the other of two binary states.

As previously known, structural circuit imbalance constituted a disadvantage because this condition tends to favor one circuit condition over the other. The present invention controls the degree of imbalance and uses it advantageously when applied to sensing. A condition which was previously considered a problem is now controlled and transformed into an advantage.

The use of complementary inverters and transmission gates provides many advantages. The circuit of FIG. 1 was built using standard complementary metal oxide semiconductor (CMOS) parts and the circuit operated over the CMOS voltage range (e.g. 3–15 volts). The "built-in" voltage difference in the quiescent points of inverters I1 and I2 will track for any operating potential in the CMOS range. Although the values of $V_Q$ of the inverters will change for different values of $V_D$ it is the relative difference in the quiescent points and not the absolute difference that is of importance.

What is claimed is:

1. A sense circuit for comparing the voltage produced by a first reference signal current having a first value with the voltage produced by a second signal current having either a first level approximately equal to said first value or a second level substantially different from said first level, comprising:

first and second capacitive nodes;

first and second inverters, each inverter having an input and an output; said first inverter having a different, predetermined, quiescent point than said second inverter for the same value of input bias applied to their respective input terminals;

means connecting the input of said first inverter to said first node, and means connecting the input of said second inverter to said second node;

a first biasing means connected between the input and the output of said first inverter for, during a first time interval, selectively providing a direct current connection therebetween and biasing said first inverter and said first node at a first quiescent point;

a second biasing means connected between the input and the output of said second inverter for, during said first time interval, selectively providing a direct current connection therebetween and biasing said second inverter and said second node at a second quiescent point other than said first quiescent point whereby a predetermined voltage offset exists between the quiescent levels at said first and second nodes;

means for, during a second time interval subsequent to said first time interval, supplying said first reference current to said first node;

means for, during said second time interval, supplying said second signal current to said second node;

the difference in the quiescent points of said first and second inverters being such that the resultant voltage offset between said first and second nodes is: (a) greater in amplitude than, and opposite in direction to, a given voltage difference generated, during said second time interval, between said first and second nodes when said second current is at said first level but exceeds said first current; and (b) substantially smaller in magnitude than the voltage differential generated, during said second time interval, between said first and second nodes when said first current has said first value and said second current has said second value; and selectively enabled cross-coupled means connected between the output of each one of said first and second inverters and the input of the other one of said first and second inverters for, during a third time interval subsequent to said second time interval, forming a flip-flop set to a first state when said first and second currents supplied to their respective nodes during said second time interval are of approximately equal value and set to its other stable state when said second signal current is at said second level and said first current has said first value.

2. The combination as claimed in claim 1 wherein said first biasing means includes a first transmission gate in series with a first impedance; wherein said second biasing means includes a second transmission gate in series with a second impedance; and wherein said cross coupling means includes third and fourth transmission gates, said third transmission gate being connected between the output of said first inverter and said second node and said fourth transmission gate being connected between the output of said second inverter and said first node; and wherein said first and second inverters are continuously powered during said first, second, and third time intervals.

3. The combination as claimed in claim 2 wherein said first and second biasing means and said cross coupling means include means for selectively enabling said first and second transmission gates and disabling said third and fourth transmission gates and for selectively disabling said first and second transmission gates and enabling said third and fourth transmission gates.

4. The combination as claimed in claim 2 wherein said first and second impedances are resistors of approximately equal ohmic value.

5. The combination as claimed in claim 4 wherein each one of said first, second, third and fourth transmission gates comprises two IGFETs of complementary conductivity type having their conduction paths connected in parallel.

6. The combination as claimed in claim 1 wherein each one of said first and second inverters is a complementary inverter comprising a first insulated-gate field-effect transistor (IGFET) of P-conductivity type and a second IGFET of N-conductivity type, each IGFET having source and drain electrodes defining the ends of a conduction path and a control electrode for controlling the conductivity of the conduction path.

7. The combination as claimed in claim 6 wherein the channel or conduction path of each IGFET has a given width to length (W/L) ratio; and wherein the ratio of the W/L of the first IGFET to the W/L of the second IGFET of the first inverter is different than the ratio of the W/L of the first IGFET to the W/L of the second IGFET of the second inverter.

8. The combination comprising:
first and second nodes;
means for applying a first signal to said first node including a metal-nitride-oxide-semiconductor (MNOS) transistor selectively biased to conduct a current into said first node, and means for applying a second signal to said second node, to be compared with said first signal, including a reference MNOS transistor selectively biased to conduct a reference current into said second node;
first and second inverters, each inverter having an input and an output; said first inverter having a different quiescent point than said second inverter for the same value of input bias applied to their respective input terminals;
means connecting the input of said first inverter to said first node, and means connecting the input of said second inverter to said second node;
a first biasing means connected between the input and the output of said first inverter for selectively providing a direct current connection therebetween and biasing said first inverter and said first node at a first quiescent point;
a second biasing means connected between the input and the output of said second inverter for selectively providing a direct current connection therebetween and biasing said second inverter and said second node at a second quiescent point other than said first quiescent point; and
selectively enabled cross coupling means connected between the output of each one of said first and second inverters and the input of the other one of said first and second inverters for selectively forming a flip flop.

9. The combination as claimed in claim 8 wherein each one of said first and second inverters is a complementary inverter comprising a first insulated-gate field-effect transistor (IGFET) of P-conductivity type and a second IGFET of N-conductivity type, each IGFET having source and drain electrodes defining the ends of a conduction path and a control electrode for controlling the conductivity the conduction path, and
wherein said first and second inverters are continuously powered.

10. The combination as claimed in claim 9 wherein the channel or conduction path of each IGFET has a given width to length (W/L) ratio; and wherein the ratio of the W/L of the first IGFET to the W/L of the second IGFET of the first inverter is different than the ratio of the W/L of the first IGFET to the W/L of the second IGFET of the second inverter.

* * * * *